United States Patent
Shim

(10) Patent No.: US 6,999,343 B2
(45) Date of Patent: Feb. 14, 2006

(54) METHOD OF PROGRAMMING A FLASH MEMORY CELL AND METHOD OF PROGRAMMING AN NAND FLASH MEMORY USING THE SAME

(75) Inventor: Sung Bo Shim, Kyungki-Do (KR)

(73) Assignee: Hynix Semiconductor Inc., Kyungki-Do (KR)

(*) Notice: Subject to any disclaimer, the term of this patent is extended or adjusted under 35 U.S.C. 154(b) by 203 days.

(21) Appl. No.: 10/738,235

(22) Filed: Dec. 17, 2003

(65) Prior Publication Data
US 2004/0190354 A1 Sep. 30, 2004

(30) Foreign Application Priority Data
Mar. 31, 2003 (KR) .................... 10-2003-0019990

(51) Int. Cl.
*G11C 16/04* (2006.01)
(52) U.S. Cl. .............................. 365/185.17; 365/185.22
(58) Field of Classification Search .......... 365/185.17, 365/185.22, 185.28
See application file for complete search history.

(56) References Cited

U.S. PATENT DOCUMENTS
6,775,184 B1 * 8/2004 Park et al. ............. 365/185.08

* cited by examiner

Primary Examiner—Vu A. Le
(74) Attorney, Agent, or Firm—Marshall, Gerstein & Borun LLP

(57) ABSTRACT

The disclosed is a method of programming a flash memory cell, comprising; a step of an over-programming of a flash memory cell to-be-programmed; a first recovering step of the over-programmed flash memory cell by adjusting a gate bias of the flash memory cell; a second recovering step of the over-programmed flash memory cell by setting the gate bias to a voltage of 0V and then adjusting a bulk bias of the over-programmed flash memory cell; a third recovering step of the over-programmed flash memory cell by floating the gate bias and then adjusting the bulk bias of the over-programmed flash memory cell; and a fourth recovering step of the over-programmed flash memory cell by adjusting the bulk bias of the over-programmed flash memory cell using a self-boosting operation.

7 Claims, 6 Drawing Sheets

METHOD OF PROGRAMMING A FLASH MEMORY CELL AND METHOD OF PROGRAMMING AN NAND FLASH MEMORY USING THE SAME

BACKGROUND

1. Field of the Invention

The present invention relates to a method of programming a flash memory cell and, more particularly, to a method of programming a flash memory cell capable of being applied to an NAND flash memory device.

2. Discussion of Related Art

Recently, semiconductor memory devices which are electrically programmable, erasable, and capable of storing data, even when power is not supplied, have been increasingly demanded. Also, a high integration technology of a memory cell has been developed to develop a high capacity memory device capable of storing a large amount of data. For this purpose, an NAND flash memory device, in which a plurality of memory cells are serially connected to form a string and a plurality of the strings constitute a memory cell array, has been proposed.

Each flash memory cell of the NAND flash memory device include a current passage between a source and a drain on a semiconductor substrate, and a floating gate and a control gate connected with insulators interposed between there on the semiconductor substrate. In addition, a typical programming operation of the flash memory cell is accomplished by grounding bulk areas, semiconductor substrates, and source areas of the memory cells, applying a high positive voltage, which is called a programming voltage Vpp of, e.g., 15V to 20V, and applying the voltage of, e.g., 5V to 6V, to the drain for programming the memory cells so as to generate hot carriers. The hot carriers are generated in such a way that electrons in the bulk area are accumulated in a floating gate by the electric field of the high voltage Vpp applied to the control gate and electrons supplied to the drain area are continuously accumulated.

FIG. 1 is a circuit diagram showing a typical NAND flash memory.

1st to 16th cells (c1 to c16) are serially connected in a first string st1. A drain of the first cell c1 is connected to a first bit line b1 through a string selection transistor d. A source of the 16th cell c16 is connected to a common source line s1 through a source selection transistor s. The second string st2 has the same structure as the first string st1. Gates of the cells in the same horizontal line are connected to the respective word lines. Though it is not apparently shown in the drawing, a flash memory is composed of a plurality of strings, as described above.

The voltage of 0V is applied to the bit line selected during the programming, whereas a power supply voltage Vcc is applied to the unselected bit line. In addition, a voltage Vpgm of, e.g., 18V is applied to the selected word line, the voltage of e.g., 4.5V is applied to a drain selection line DSL1, and the voltage of 0V is applied to a source selection line SSL1. Also, the voltage of, e.g., 10V is applied to the unselected word lines. Then, the cells selected by such a voltage condition are individually programmed.

Now, the conventional programming method will be further described in detail with reference to FIG. 2.

At the beginning of the programming, the aforementioned programming voltages are applied to the selected cells during one pulse period so as to execute a programming operation (Step 100). Then, it is verified whether the programming operation is normally accomplished or not(Step 110). As a result, if the programming is normally accomplished, the programming is terminated. Otherwise, the programming is returned to the above Step 100 to execute the programming operation again.

According to such a programming method, the cells can be over-programmed. The over-programmed cells determine a gate bias Vpp applied to the unselected cells during a read-out operation. If this bias is increased by the over-programmed voltage, a program disturbance occurs in the read-out operation by such a bias. A method of improving these shortcomings is shown in FIG. 3.

FIG. 3 is a flow chart for explaining another conventional programming method.

At the beginning of the programming, the aforementioned programming voltages are applied to the selected cells during one pulse period (that is, a cycle) so as to execute a programming operation (Step 200). Then, it is verified whether the programming operation is normally accomplished or not (Step 210). As a result, if the programming is normally accomplished, the programming is terminated. Otherwise, the programming is returned to the above Step 200 after incrementing the gate programming voltage (Step 220) to execute the programming operation again. Such a programming method is called an incremental step pulse programming (ISPP). According to such a programming method, some of the cells can be over-programmed by the width of the pulse.

FIG. 4 shows a threshold voltage distribution according to the number of the cells after the programming. Herein, a solid line indicates a threshold voltage distribution when the programming is normally accomplished, whereas the dotted line indicates a threshold voltage distribution when the over-programming occurs.

SUMMARY OF THE INVENTION

Accordingly, the present invention is directed to provide a method of programming a flash memory cell capable of solving the above problems by over-programming the cells in advance and then recovering the over-programmed cells so as to maintain a threshold voltage, which corresponds to a normal programming operation.

One aspect of the present invention is to provide a method of programming a flash memory cell, comprising; a step of an over-programming of a flash memory cell to-be-programmed; a first recovering step of the over-programmed flash memory cell by adjusting a gate bias of the flash memory cell; a second recovering step of the over-programmed flash memory cell by setting the gate bias to a voltage of 0V and then adjusting a bulk bias of the over-programmed flash memory cell; a third recovering step of the over-programmed flash memory cell by floating the gate bias and then adjusting the bulk bias of the over-programmed flash memory cell; and a fourth recovering step of the over-programmed flash memory cell by adjusting the bulk bias of the over-programmed flash memory cell using a self-boosting operation.

In the aforementioned of the method of programming a flash memory cell according to another embodiment of the present invention, wherein the voltage of about 20V is applied to the gate of the flash memory cell during the over-programming step.

In the aforementioned of the method of programming a flash memory cell according to another embodiment of the present invention, wherein the voltage of about 8V is applied to the gate of the flash memory cell during the over-programming step.

In the aforementioned of the method of programming a flash memory cell according to another embodiment of the present invention, wherein the voltage of about 12V to about 13V is applied to the bulk and the gate of the flash memory cell is grounded during the second recovering step.

In the aforementioned of the method of programming a flash memory cell according to another embodiment of the present invention, wherein the voltage of 8V is applied to the bulk and the gate of the flash memory cell is floated during the third recovering step.

In the aforementioned of the method of programming a flash memory cell according to another embodiment of the present invention, wherein the voltage of 12V+Vtn is applied to a drain of the flash memory cell and the voltage of 0V is applied to the gate of the flash memory cell during the fourth recovering step.

Another aspect of the present invention is to provide a method of programming an NAND flash memory, comprising: an over-programming step of all flash memory cells connected to a selected word line W/L; a first recovering step of the over-programmed flash memory cells by adjusting a gate bias which is applied to the word line; a second recovering step the over-programmed flash memory cells by setting the gate bias which is applied to the word line to a voltage of 0V and then adjusting a bulk bias of the over-programmed flash memory cells; a third recovering step of the over-programmed flash memory cells by floating the word line and then adjusting the bulk bias of the over-programmed flash memory cells; a fourth recovering step of the over-programmed flash memory cells by adjusting the bulk bias of the over-programmed flash memory cells using a self-boosting operation; a verifying step of whether the flash memory cells are normally programmed or not; and a step of returning to the first recovering step or returning to the first recovering step after increasing each bias of the first to fourth recovering steps, depending on the result of the verifying step.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
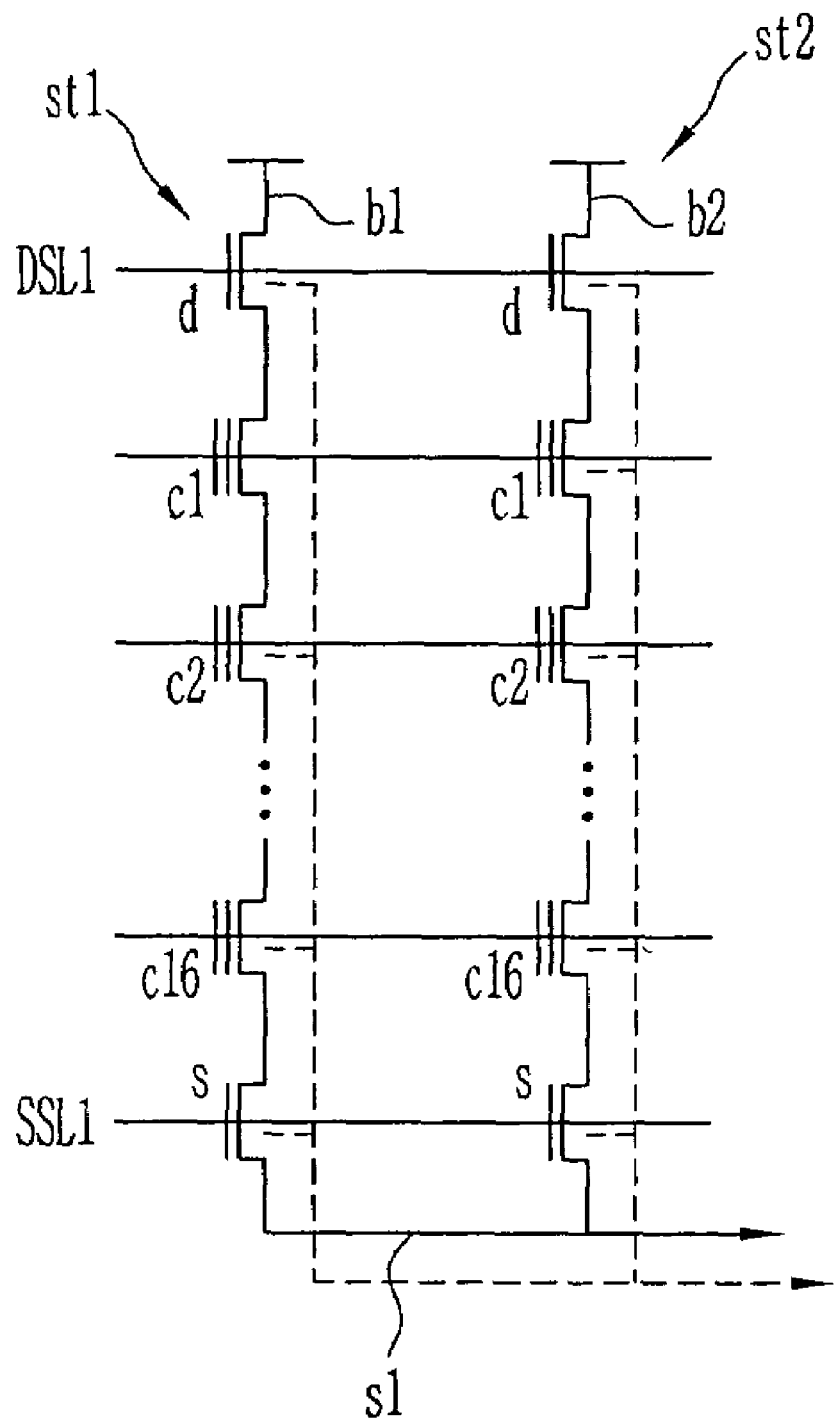
FIG. 1 is a circuit diagram showing a typical NAND flash memory.
Figure 2:
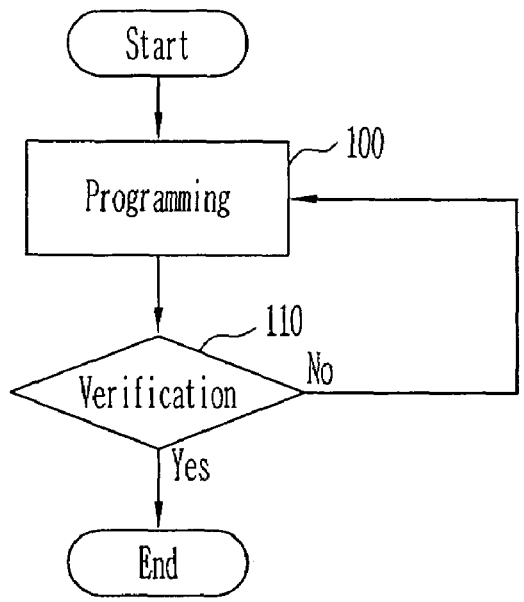
FIG. 2 is a flow chart for explaining a conventional method of programming an NAND flash memory.
Figure 3:
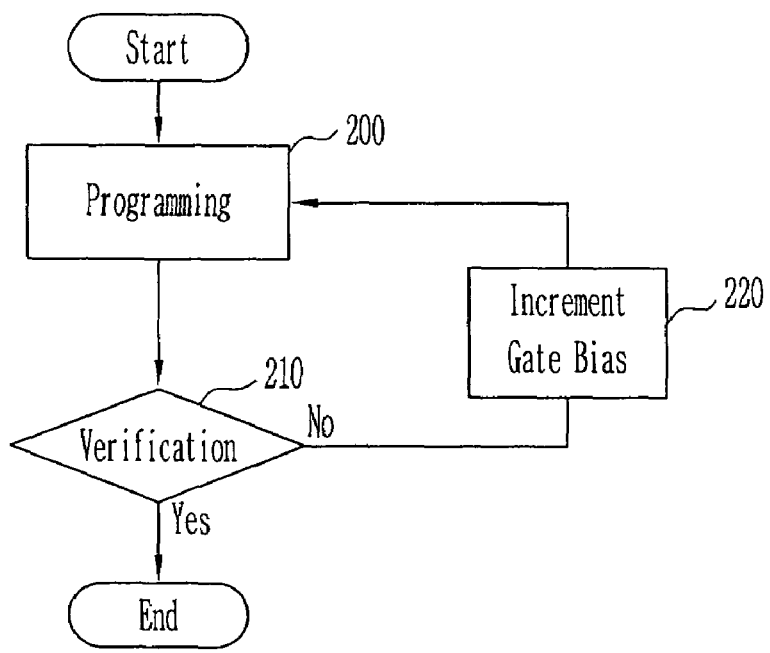
FIG. 3 is a flow chart for explaining a conventional method of programming an NAND flash memory.

The present invention will be described in detail by way of the preferred embodiment with reference to the accompanying drawings, in which like reference numerals are used to identify the same or similar parts.

According to the present invention, it is assumed that a tunneling effect occurs when the voltage applied to a tunnel oxidation film of a flash memory cell reaches 8V or more and the voltage applied to an ONO film reaches 10V or more. The reason is that the ONO film is thicker than the tunnel oxidation film.

The principle of the present invention is to recover the over-programmed cells by means of an electric field applied to the ONO film and the tunnel oxidation film.

Now, a method of programming an NAND flash memory according to the present invention will be described with reference to Table 1.

TABLE 1

|  | Over-programming step | first Recovering step | second recovering step | third recovering step | fourth recovering step |
|---|---|---|---|---|---|
| W/L | 20 V or more | 8 V or more | 0 | F | 0 |
| DSL | Vcc | Vcc | Vcc | Vcc | Vcc |
| SSL | 0 | 0 | 0 | 0 | 0 |
| B/L | 0 | F | F | F | 12 V + Vtn of more |
| Source | 0 | 0 | 0 | 0 | 0 |
| Bulk | 0 | F | 12–13 V | 8 V or less | 0 |

(1) Over-programming Step; A voltage of 20V or more is applied to a selected word line W/L and a power supply voltage Vcc is applied to a drain selection line DSL. In addition, a voltage of 0V is applied to a selected bit line B/L, a source selection line SSL, and a bulk area.

If the over-programming is accomplished under the aforementioned voltage condition, the following first to fourth recovery steps are executed, so that the cell to be programmed has a threshold voltage, which corresponds to a normal programming.

(2) First recovering Step; the voltage of 8V or more is applied to the selected word line, the power supply voltage Vcc is applied to a drain selection line, and the voltage of 0V is applied to the source selection line. The bit line and the bulk are set to be floated. The voltage of 0V is applied to the source.

(3) Second recovering step; the voltage of 0V or more is applied to the selected word line, the power supply voltage Vcc is applied to the drain selection line, and the voltage of 0V is applied to the source selection line. The bit line is set to be floated. The voltage of 0V is applied to the source and the voltage of 12V to 13V is applied to the bulk.

(4) Third recovering step; the selected word line is floated, the power supply voltage Vcc is applied to the drain selection line, and the voltage of 0V is applied to the source selection line. The bit line is set to be floated. The voltage of 0V is applied to the source, and the voltage of 8V is applied to the bulk.

(5) Fourth recovering step; the voltage of 0V is applied to the selected word line, the power supply voltage Vcc is applied to the drain selection line, and the voltage of 0V is applied to the source selection line. The voltage of 0V is applied to the source and the bulk while the voltage of 12V+Vtn is applied to the bit line.

Now, the recovering steps will be described in more detail.

The first recovering step has a bias condition in which it is assumed that a coupling ratio is set to 0.5, a gate bias voltage Vpass applied to the unselected word line is set to 4.5V, and a target threshold voltage is set to 3V. In this case, since the bulk is set to be floated, voltage difference between the applied bias and the voltage associated with the charges in the floating gate generates discharge when a voltage associated with the electric field applied to the ONO film reaches 10V or more. In other words, in order to set the target voltage to 3V, a voltage of 8V is applied to the gate of the selected cells so that the threshold voltages of only the over-programmed cells are set to 3V.

In the second recovering step, when the voltage of 13V is applied to the bulk of the cells of which the threshold voltages are set to 5V, the voltage of 9V is applied to the tunnel oxidation film, and the voltage of 4V is applied to the ONO film. The discharge occurs until the threshold voltage reaches 3V, namely, until the voltage of 8V is applied to the tunnel oxidation film. In this case, the erased cells having the threshold voltage of −3V are not discharged because the voltage of 6V is applied to the tunnel oxidation film and a voltage of 8V is applied to the ONO film. For this reason, the discharge operations are carried out for only the over-programmed cells.

In the third recovering step, the gate is set to be floated. Therefore, the bias coupling does not occur, unlike the above case in which the gate is grounded. In addition, since it is determined whether discharge occurs in accordance with the amount of charges stored in each of floating gates, the recovery can be accomplished by applying just 8V to the bulk. The bit line is recovered by using a self-boost structure where the voltage of 0V is applied to the gates of the strings. Therefore, the voltage boosted to the channel is the bias applied to the bit line subtracted by the threshold voltage of the selection transistor.

The fourth recovering step is similar to the second recovering step.

As described above, the threshold voltages of only the over-programmed cells can be shifted to a desired level by an electric field applied to the tunnel oxidation film and the ONO film.

Figure 5:
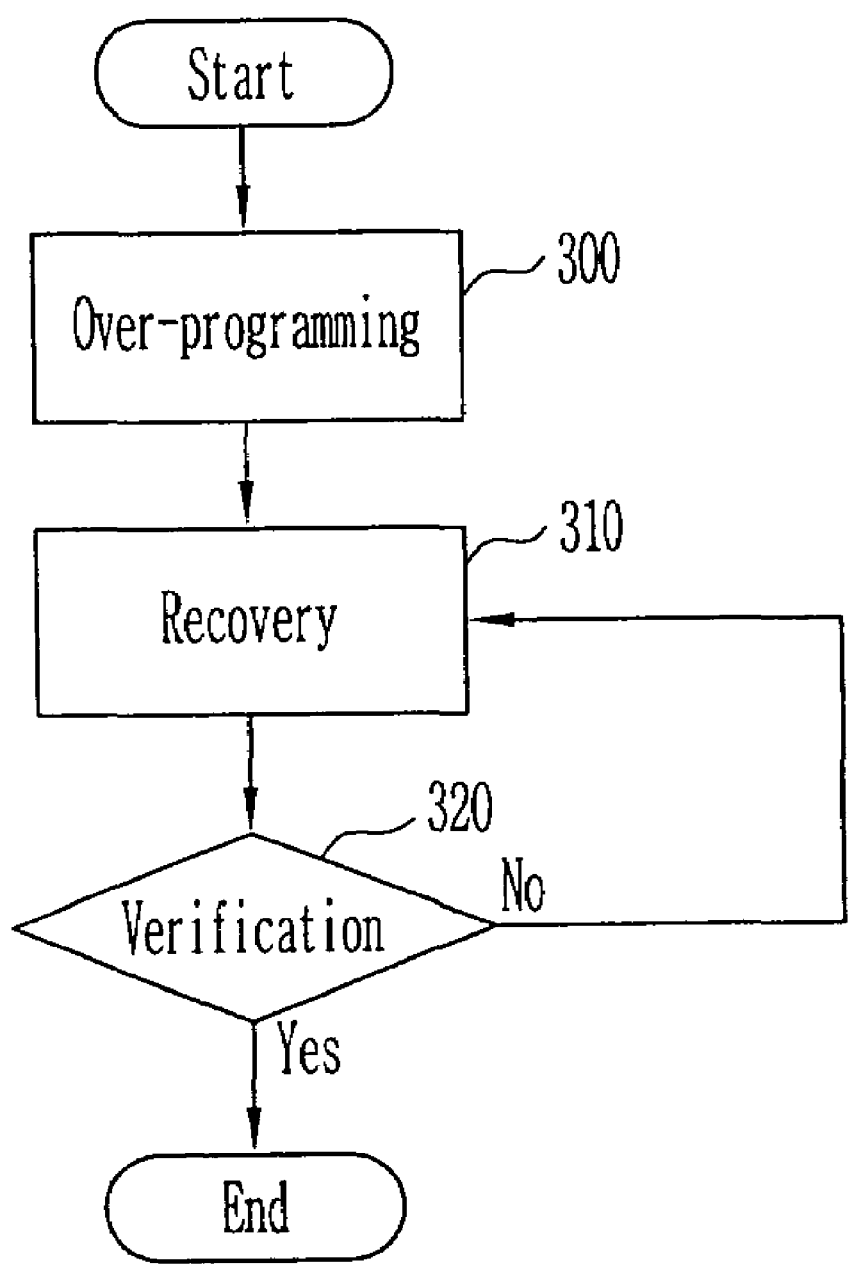
FIG. 5 is a flow chart for explaining a method of programming an NAND flash memory according to a first embodiment of the present invention.

Now, the present invention will be described in more detail with reference to FIG. 5.

At the beginning of the programming, the aforementioned over-programming is executed (Step 300). Then, the aforementioned first to fourth recovering steps are executed to allow the to-be-programmed cells to have a normal threshold voltage (Step 310). Then, it is verified whether the programming is normally accomplished or not (Step 320). As a result, if the programming is normally accomplished, the programming is terminated. Otherwise, the programming is returned to the Step 310 to execute the recovering operations again.

Figure 6:
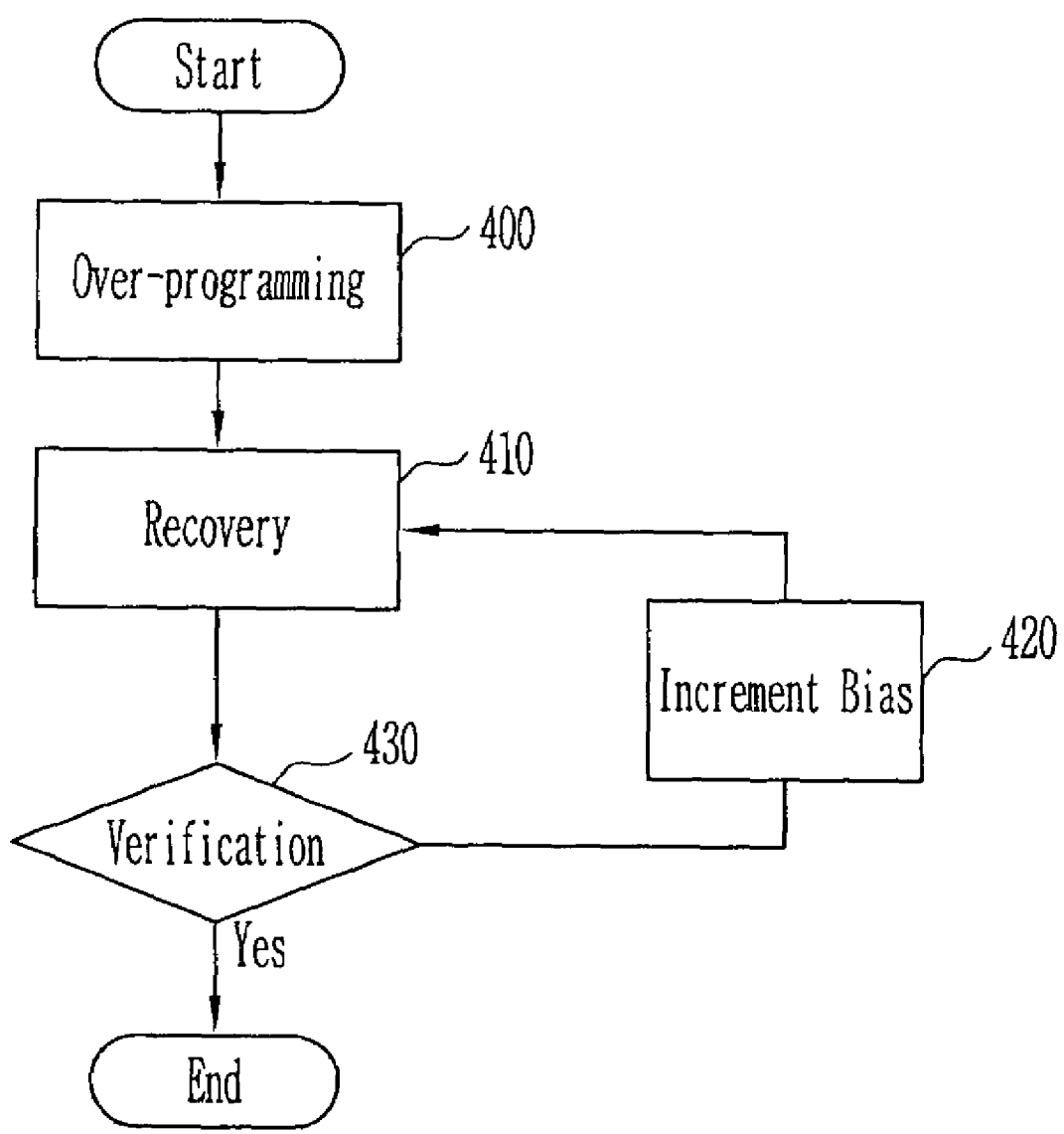
FIG. 6 is a flow chart for explaining a method of programming an NAND flash memory according to a second embodiment of the present invention.

FIG. 6 is a flow chart for explaining another programming method according to the present invention.

At the beginning of the programming, the aforementioned over-programming is executed (Step 400). Then, the aforementioned first to fourth recovering steps are executed to allow the to-be-programmed cells to have a normal threshold voltage (Step 410). It is verified whether the programming is normally accomplished or not (Step 430). As a result, if the programming is normally accomplished, the programming is terminated. Otherwise, the programming is returned to the Step 410 to execute the recovering operation again after increasing the voltages applied to each recovering step.

Figure 4:
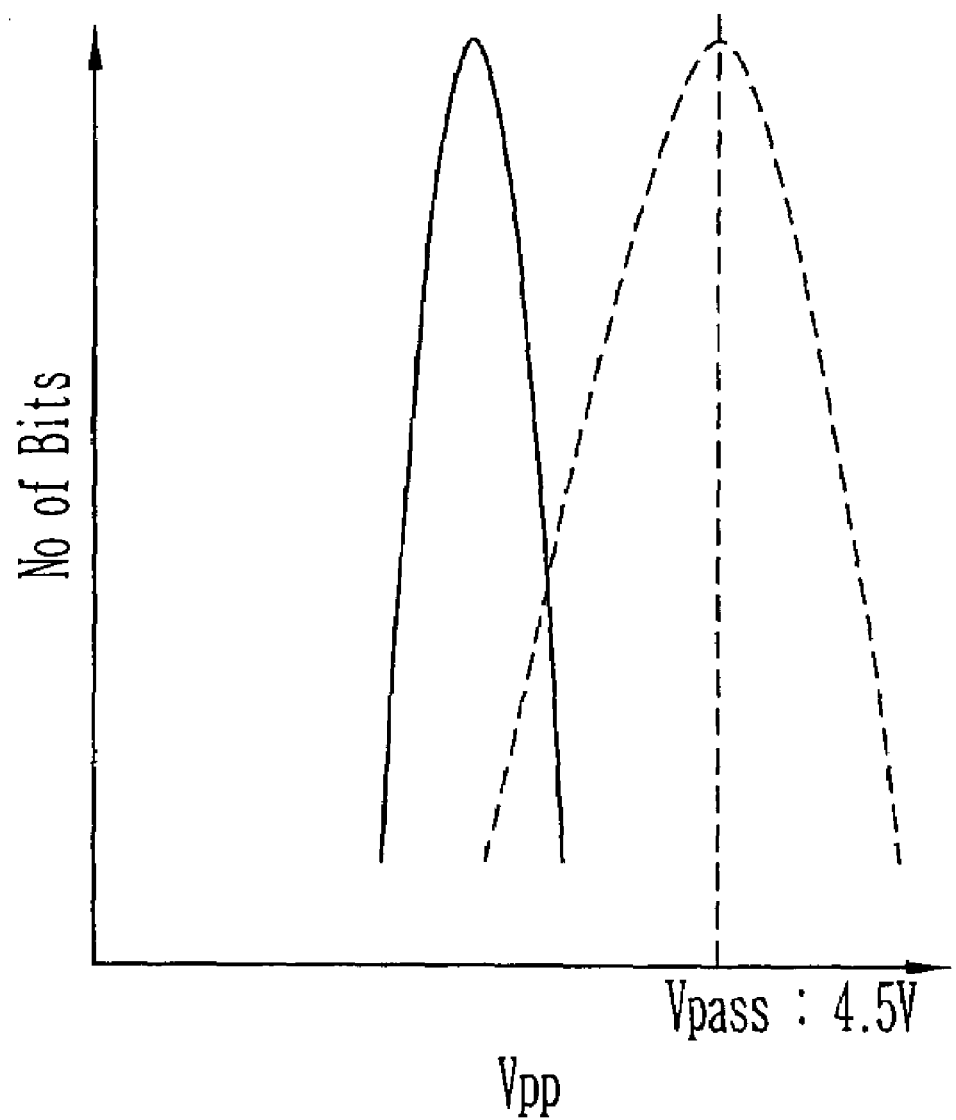
FIG. 4 shows a threshold voltage distribution after programming according to the conventional method.
Figure 7:
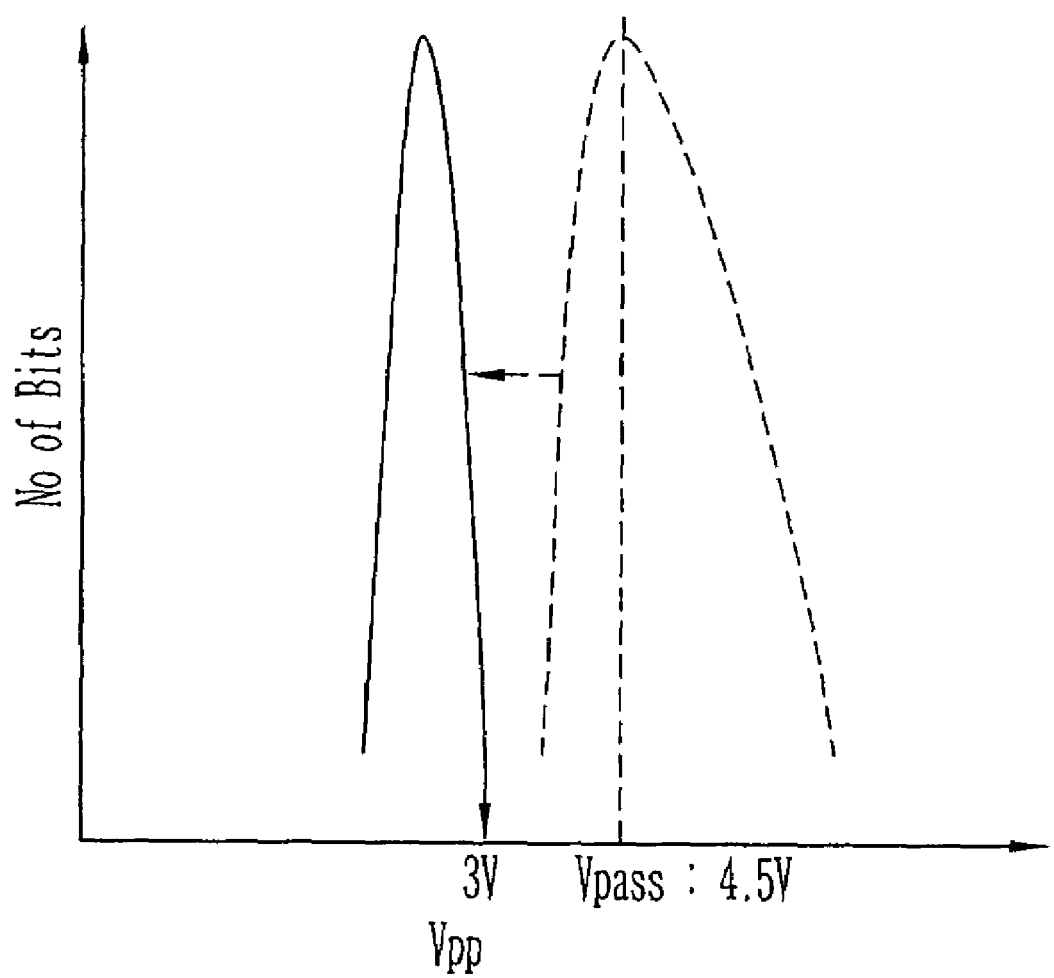
FIG. 7 shows a threshold voltage distribution after programming according to the present invention.

FIGS. 4 and 7 show a threshold voltage distribution according to the number of cells after programming. Herein, the dotted line indicates the threshold voltage distribution after the over-programming, whereas the solid line indicates the threshold voltage distribution after completing the normal programming by the recovering operations.

As shown in FIG. 7, according to the present invention, the threshold voltage distribution of the cell after programming is maintained at the level of 3V or less.

As described above, according to the present invention, it is possible to recover the read-out operation failures generated by the over-programming and set up the target threshold voltage freely as the time of programming the cells, so that it can be used as a method of programming multi-level cells.

The present invention has been described with reference to specific exemplary embodiments thereof. It will, however, be evident that various modifications and changes may be made thereto without departing from the broader scope and spirit of the invention as set forth in the appended claims. The specification and drawings are, accordingly, to be regarded in an illustrative rather than in a restrictive sense.

What is claimed is:

1. A method of programming a flash memory cell, comprising;
   a step of an over-programming of a flash memory cell to-be-programmed;
   a first recovering step of the over-programmed flash memory cell by adjusting a gate bias of the flash memory cell;
   a second recovering step of the over-programmed flash memory cell by setting the gate bias to a voltage of 0V and then adjusting a bulk bias of the over-programmed flash memory cell;
   a third recovering step of the over-programmed flash memory cell by floating the gate bias and then adjusting the bulk bias of the over-programmed flash memory cell; and
   a fourth recovering step of the over-programmed flash memory cell by adjusting the bulk bias of the over-programmed flash memory cell using a self-boosting operation.

2. The method of programming a flash memory cell according to claim 1, wherein the voltage of about 20V is applied to the gate of the flash memory cell during the over-programming step.

3. The method of programming a flash memory cell according to claim 1, wherein the voltage of about 8V is applied to the gate of the flash memory cell during the over-programming step.

4. The method of programming a flash memory cell according to claim 1, wherein the voltage of about 12V to about 13V is applied to the bulk and the gate of the flash memory cell is grounded during the second recovering step.

5. The method of programming a flash memory cell according to claim 1, wherein the voltage of 8V is applied to the bulk and the gate of the flash memory cell is floated during the third recovering step.

6. The programming method of a flash memory cell according to claim 1, wherein the voltage of 12V+Vtn is applied to a drain of the flash memory cell and the voltage of 0V is applied to the gate of the flash memory cell during the fourth recovering step.

7. A method of programming an NAND flash memory, comprising:

an over-programming step of all flash memory cells connected to a selected word line W/L;

a first recovering step of the over-programmed flash memory cells by adjusting a gate bias which is applied to the word line;

a second recovering step the over-programmed flash memory cells by setting the gate bias which is applied to the word line to a voltage of 0V and then adjusting a bulk bias of the over-programmed flash memory cells;

a third recovering step of the over-programmed flash memory cells by floating the word line and then adjusting the bulk bias of the over-programmed flash memory cells;

a fourth recovering step of the over-programmed flash memory cells by adjusting the bulk bias of the over-programmed flash memory cells using a self-boosting operation;

a verifying step of whether the flash memory cells are normally programmed or not; and a step of returning to the first recovering step or returning to the first recovering step after increasing each bias of the first to fourth recovering steps, depending on the result of the verifying step.

* * * * *